(12) United States Patent
Hokomoto et al.

(10) Patent No.: US 7,358,564 B2
(45) Date of Patent: *Apr. 15, 2008

(54) SEMICONDUCTOR DEVICE

(75) Inventors: Yoshitaka Hokomoto, Kawasaki (JP); Akio Takano, Kawasaki (JP); Bungo Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 377 days.

This patent is subject to a terminal disclaimer.

(21) Appl. No.: 11/115,121

(22) Filed: Apr. 27, 2005

(65) Prior Publication Data

US 2006/0197146 A1    Sep. 7, 2006

(30) Foreign Application Priority Data

Mar. 4, 2005    (JP) ............................. 2005-060439

(51) Int. Cl.
*H01L 29/76* (2006.01)
(52) U.S. Cl. ...................... 257/328; 257/335; 257/341
(58) Field of Classification Search ............... 257/328, 257/335, 341
See application file for complete search history.

(56) References Cited

U.S. PATENT DOCUMENTS

| | | | |
|---|---|---|---|
| 5,155,563 A | 10/1992 | Davies et al. | |
| 5,869,875 A | 2/1999 | Hebert | |
| 6,107,160 A | 8/2000 | Hebert et al. | |
| 6,372,557 B1 | 4/2002 | Leong | |
| 6,727,127 B1 | 4/2004 | Darmawan et al. | |
| 7,019,361 B2 * | 3/2006 | Nakayama et al. | ........ 257/335 |
| 2002/0030226 A1 | 3/2002 | Yasuhara et al. | |
| 2002/0167047 A1 | 11/2002 | Yasuhara et al. | |
| 2004/0046202 A1 | 3/2004 | Nakayama et al. | |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A semiconductor device comprises a semiconductor substrate having an upper surface and a lower surface. A semiconductor layer is formed on the upper surface of the semiconductor substrate. A base region of a first conduction type is formed in the semiconductor layer. A source region of a second conduction type is formed in the base region. A drain region of the second conduction type is formed apart from the source region in the semiconductor layer. A gate electrode is formed on a gate insulator above the semiconductor layer between the source region and the drain region. A first interlayer insulator is formed on the semiconductor layer to cover the gate electrode. A short electrode is formed to short the base region and the source region. A second interlayer insulator is formed to cover the first interlayer insulator and the short electrode. A drain electrode is formed over the second interlayer insulator and connected to the drain region with the use of a contact hole formed through the first and second interlayer insulators. A source electrode is formed on the lower surface of the semiconductor substrate. The short electrode extends over the first interlayer insulator from the source region toward the drain region. A side of the short electrode at least coincides with a side of the gate electrode located toward the drain region with respect to positions in a direction defined as directing from the source region toward the drain region.

20 Claims, 8 Drawing Sheets

SEMICONDUCTOR DEVICE

CROSS-REFERENCE TO RELATED APPLICATION

This application is based upon and claims the benefit of priority from the prior Japanese Patent Application No. 2005-060439, filed on Mar. 4, 2005; the entire contents of which are incorporated herein by reference.

BACKGROUND OF THE INVENTION

1. Field of the Invention

The present invention relates to a semiconductor device such as a power MOSFET (Metal Oxide Semiconductor Field Effect Transistor).

2. Description of the Related Art

A power semiconductor device, typically including the power MOSFET, has a low on-resistance and a high switching speed and can efficiently control a large current of a high frequency. Accordingly, the power MOSFET has been utilized wide as a small power conversion element, for example, as a component of a power source in a personal computer.

The power MOSFET comprises a semiconductor chip with a structure that includes a plurality of cells formed in an epitaxial layer disposed on a semiconductor substrate and having gate electrodes commonly connected. This FET may include the type that has a source electrode formed on the lower surface of the semiconductor substrate and a drain electrode formed on the cell side (see, for example, JP-A 2004-158813, FIGS. 1-2).

In this type, as an interlayer insulator is sandwiched between the gate electrode and the drain electrode and these electrodes are both formed on a surface side of wafer, a parasitic capacitance (feedback capacitance Crss) which is constituted by the gate, the drain and the interlayer insulator may be caused. The feedback capacitance greatly influences on the switching speed because a large feedback capacitance lowers the switching speed.

BRIEF SUMMARY OF THE INVENTION

According to one aspect of the present invention, there is provided a semiconductor device comprises a semiconductor substrate having an upper surface and a lower surface; a semiconductor layer formed on the upper surface of the semiconductor substrate; a base region of a first conduction type formed in the semiconductor layer; a source region of a second conduction type formed in the base region; a drain region of the second conduction type formed apart from the source region in the semiconductor layer; a gate electrode formed on a gate insulator above the semiconductor layer between the source region and the drain region; a first interlayer insulator formed on the semiconductor layer to cover the gate electrode; a short electrode formed to short the base region and the source region; a second interlayer insulator formed to cover the first interlayer insulator and the short electrode; a drain electrode formed over the second interlayer insulator and connected to the drain region with the use of a contact hole formed through the first and second interlayer insulators; and a source electrode formed on the lower surface of the semiconductor substrate, wherein the short electrode extends over the first interlayer insulator from the source region toward the drain region such that a side of the short electrode at least coincides with a side of the gate electrode located toward the drain region with respect to positions in a direction defined as directing from the source region toward the drain region.

According to another aspect of the present invention, there is provided a semiconductor device comprises a semiconductor substrate having an upper surface and a lower surface; a semiconductor layer formed on the upper surface of the semiconductor substrate; a base region of a first conduction type formed in the semiconductor layer; a source region of a second conduction type formed in the base region; a drain region of the second conduction type formed apart from the source region in the semiconductor layer; a gate electrode formed on a gate insulator above the semiconductor layer between the source region and the drain region; a first interlayer insulator formed on the semiconductor layer to cover the gate electrode; a short electrode formed to short the base region and the source region; a second interlayer insulator formed to cover the first interlayer insulator and the short electrode; a drain electrode formed above the second interlayer insulator and connected to the drain region with the use of a contact hole formed through the first and second interlayer insulators; and a source electrode formed on the lower surface of the semiconductor substrate, wherein the drain electrode is at least partly removed from above the gate electrode.

According to yet another aspect of the present invention, there is provided a semiconductor device comprises a semiconductor substrate having an upper surface and a lower surface; a semiconductor layer formed on the upper surface of the semiconductor substrate; a base region of a first conduction type formed in the semiconductor layer; a source region of a second conduction type formed in the base region; a drain region of the second conduction type formed apart from the source region in the semiconductor layer; a gate electrode formed on a gate insulator above the semiconductor layer between the source region and the drain region; a first interlayer insulator formed on the semiconductor layer to cover the gate electrode; a short electrode formed to short the base region and the source region; a second interlayer insulator formed to cover the first interlayer insulator and the short electrode; a drain electrode formed over the second interlayer insulator and connected to the drain region with the use of a contact hole formed through the first and second interlayer insulators; and a source electrode formed on the lower surface of the semiconductor substrate, wherein the second interlayer insulator has a surface located higher in a region defined by formation of the first interlayer insulator than in a region defined by removal of the first interlayer insulator.

DETAILED DESCRIPTION OF THE INVENTION

Figure 1:
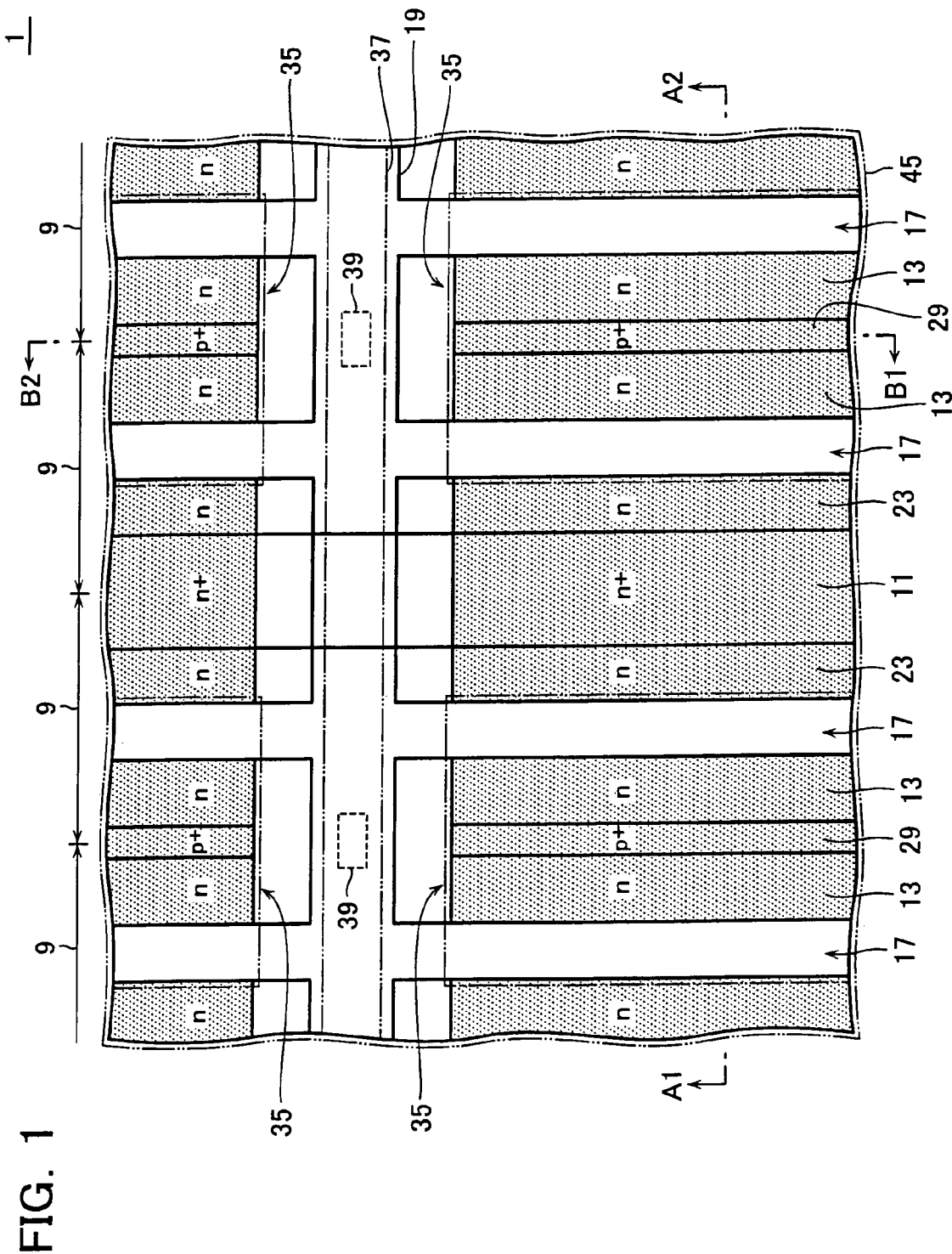
FIG. 1 is a plan view of part of a semiconductor device according to a first embodiment.

The embodiments of the present invention will now be described with the use of the drawings. In the figures illustrative of the embodiments, the parts same as or similar to those denoted with the reference numerals already described in the figures are given the same reference numerals and omitted from the following description. The semiconductor devices according to the embodiments are power MOSFETs. These semiconductor devices are of the MOS type, in which a gate insulator contains a silicon oxide. The embodiments of the present invention are not limited to this type but also applicable to the MIS (Metal Insulator Semiconductor) type, in which a gate insulator contains an insulator (for example, a high dielectric) other than the silicon oxide.

First Embodiment

Figure 2:
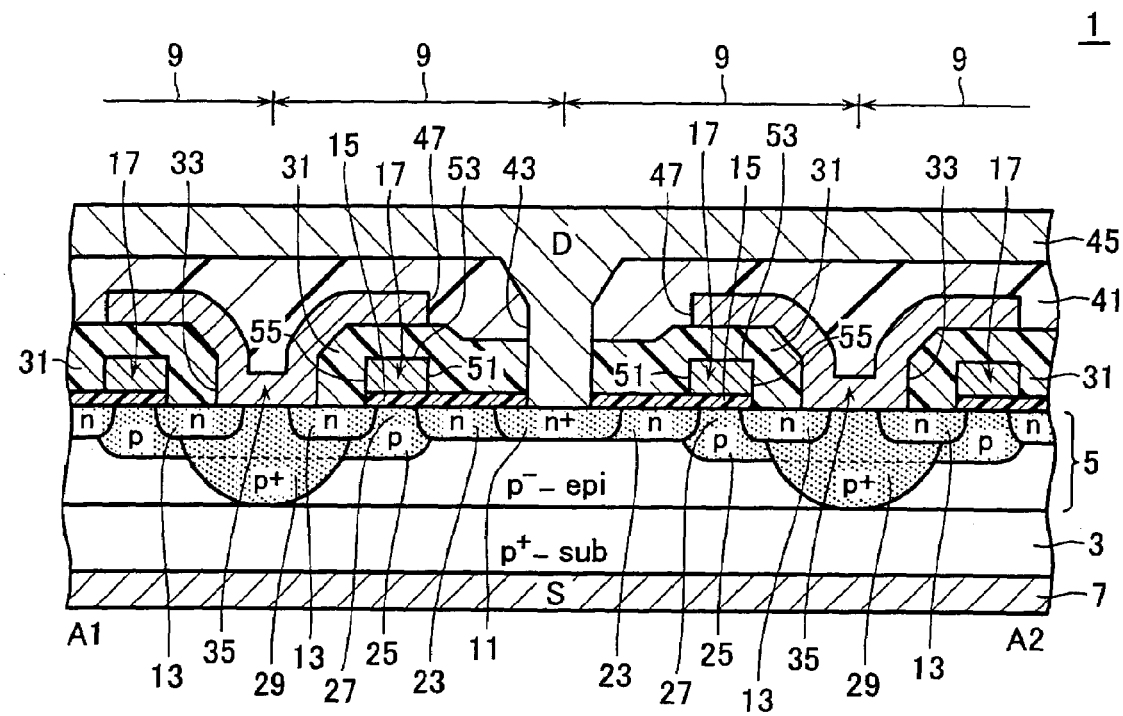
FIG. 2 is a cross-sectional view taken along A1-A2 line in FIG. 1.
Figure 3:
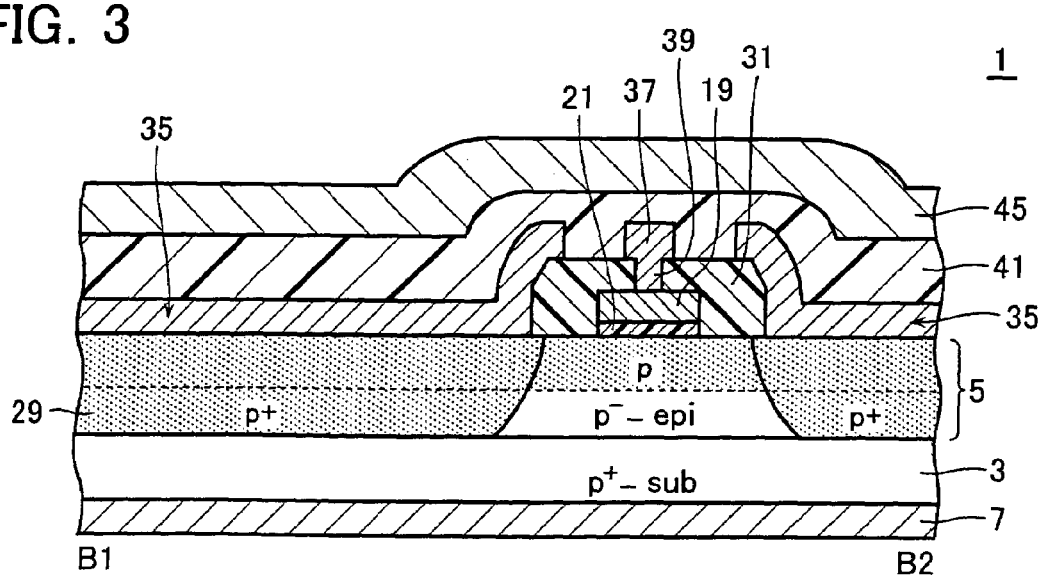
FIG. 3 is a cross-sectional view taken along B1-B2 line in FIG. 1.

In the first embodiment, a short electrode is extended so that the position of a side of the short electrode coincides with the position of a side of a gate electrode located toward a drain region. This is effective to reduce a parasitic capacitance (feedback capacitance Crss) associated with a gate and a drain. FIG. 1 is a plan view of part of a semiconductor device 1 according to the first embodiment. FIG. 2 is a cross-sectional view taken along A1-A2 line in FIG. 1. FIG. 3 is a cross-sectional view taken along B1-B2 line in FIG. 1.

The semiconductor device 1 comprises a $p^+$-type silicon substrate (an example of the semiconductor substrate) 3, and a $p^-$-type epitaxial layer 5, which is a semiconductor layer formed on the upper surface of the substrate. The silicon substrate 3 serves as a $p^+$-type source region. The entire lower surface of the silicon substrate 3 is in contact with a source electrode 7.

The epitaxial layer 5 includes a plurality of cells 9 formed therein. A cell 9 includes an $n^+$-type drain region 11 and an n-type source region 13 formed in the surface layer of the epitaxial layer 5 separately from each other. It also includes a gate electrode 17 formed on a gate oxide 15 (an example of the gate insulator) above the epitaxial layer 5 between the drain region 11 and the source region 13.

The gate electrodes 17 of the cells 9 extend in a direction over the epitaxial layer 5 and commonly connected to a gate line 19 intersecting at a right angle thereto. The gate electrodes 17 and the gate line 19, containing polysilicon, are patterned at the same time. An insulator 21 (FIG. 3), formed together with a gate oxide 15, is interposed between the gate line 19 and the epitaxial layer 5.

In the epitaxial layer 5 between the drain region 11 and the gate electrodes 17, an n-type LDD (Lightly Doped Drain) region 23 is formed adjacent to the drain region 11. In the epitaxial layer 5, a p-type base region 25 deeper than the drain region 11 is formed adjacent to the LDD region 23 beneath the gate electrode 17. The surface layer of the base region 25 beneath the gate electrode 17 provides a channel formation region 27. The drain region 11 and the source region 13 are brought into conduction through the channel and the LDD region 23.

In the base region 25, the source regions 13 in adjacent cells 9 are formed separately from each other. A $p^+$-type conduction region 29 is formed between the adjacent source regions as extending to the silicon substrate 3 through the base region 25.

A first interlayer insulator (such as silicon oxide) 31 is formed over the epitaxial layer 5 for covering the gate electrode 17 and the gate line 19. A through hole 33 is formed through the first interlayer insulator 31 to expose the source region 13 and the base region 25 in the conduction region 29. A short electrode 35 of aluminum is formed in the through hole 33. The short electrode 35 shorts the source regions 13 and the base region 25. The short electrode 35 has a shape that is a primary characteristic of the first embodiment, which is described later in relation to the effect of the first embodiment.

An aluminum line 37 is formed on the first interlayer insulator 31 above the gate line 19, extending in the same direction as the gate line 19 extends. The aluminum line 37 is formed together with the short electrode 35. The aluminum line 37 is connected to the gate line 19 via a contact portion 39 formed through the first interlayer insulator 31.

The short electrode 35, the aluminum line 37 and the first interlayer insulator 31 are covered in a second interlayer insulator (such as silicon oxide) 41. A contact hole 43 is formed through the first interlayer insulator 31 and the second interlayer insulator 41 and connected to the drain region 11. A drain electrode 45 of a metal (such as aluminum) is formed over entire the second interlayer insulator 41. Thus, the upper surface of the semiconductor device 1 is covered in the drain electrode 45 except for regions used to form gate electrode pads (not shown). The gate electrode pads are employed to connect the gate electrode 17 to external. The metal of the drain electrode 45 is buried in the contact hole 43 and connected to the drain region 11. Sides of the upper portion of the contact hole 43 are tapered to facilitate the metal to be buried in the contact hole 43.

A primary effect of the first embodiment is described next. A parasitic capacitance associated with the gate and the drain, or a feedback capacitance Crss, has a value derived from addition of the following (1), (2) and (3):

(1) A parasitic capacitance between the gate electrode 17 and the LDD region 23 and between the gate electrode 17 and drain region 11;

(2) A parasitic capacitance between the gate electrode 17 and the drain electrode 45 in the contact hole 43; and (3) A parasitic capacitance between the gate electrode 17 and the drain electrode 45 on the second interlayer insulator 41.

In the semiconductor device according to the first embodiment shown in FIG. 2, the short electrode 35 extends over the first interlayer insulator 31 from the source region 13 toward the drain region 11. In this case, a side 47 of the short electrode 35 coincides (almost coincides) with a side 51 of the gate electrode 17 located toward the drain region with respect to positions in a direction defined as directing from the source region 13 toward the drain region 11. When part of the short electrode 35 is employed in this way to completely cover the upper surface 53 of the gate electrode 17, the parasitic capacitance of the above (3) can be reduced. Accordingly, the first embodiment is effective to reduce the feedback capacitance and achieve the high-speed switching.

Figure 4:
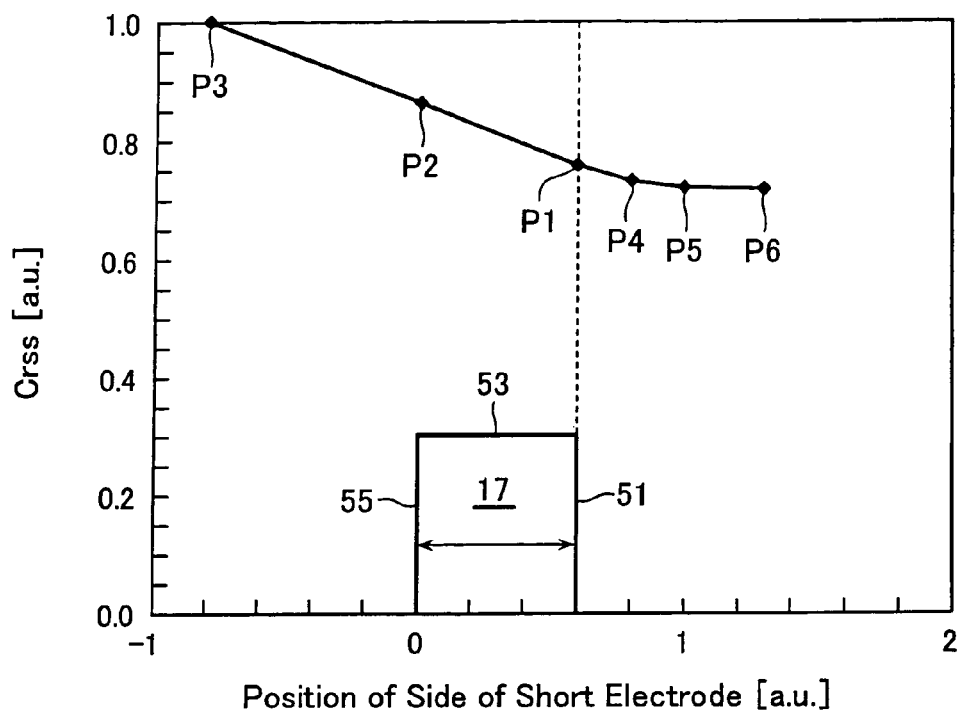
FIG. 4 is a graph showing a feedback capacitance in relation to a position of a side of a short electrode.

It is confirmed through a simulation that the feedback capacitance can be reduced in accordance with the first embodiment. FIG. 4 is a graph showing the result with the lateral axis indicative of the position of the side 47 of the short electrode 35 and the vertical axis indicative of the feedback capacitance Crss, where a. u. denotes an arbitrary unit. The position of the side 55 of the gate electrode 17 located toward the source region is set to zero on the lateral axis.

As can be seen, the feedback capacitance Crss is made lower when the position of the side 47 of the short electrode 35 coincides with the position of the side 51 of the gate electrode 17 located toward the drain region (P1) than when it is located closer to the source region 13 (P2, P3). Thus, the feedback capacitance can be reduced in accordance with the first embodiment as is evident from the result of the simulation.

Second Embodiment

Figure 5:
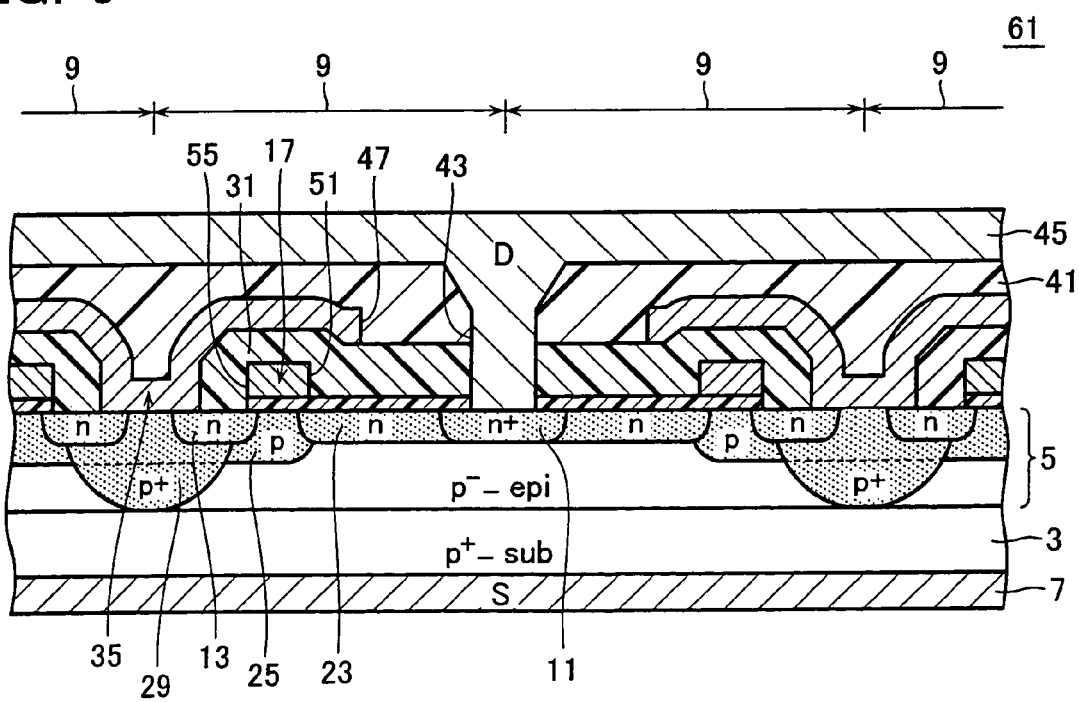
FIG. 5 is a cross-sectional view of a semiconductor device according to a second embodiment.

FIG. 5 is a cross-sectional view of a semiconductor device 61 according to a second embodiment and corresponds to FIG. 2. The second embodiment mainly differs from the first embodiment in the position of the side 47 of the short electrode 35. In a word, the side 47 of the short electrode 35 is located closer to the contact hole 43 than the side 51 of the gate electrode 17 located toward the drain region with respect to positions in the direction defined as directing from the source region 13 toward the drain region 11. The semiconductor device 61 according to the second embodiment can be realized if the distance between the gate electrode 17 and the contact hole 43 is larger than the minimum process dimension.

The feedback capacitance Crss can be made lower in the second embodiment than in the first embodiment as described with reference to the graph of FIG. 4. As can be seen, the feedback capacitance Crss is lower when the side 47 of the short electrode 35 is located closer to the side 51 of the gate electrode 17 located toward the drain region (P4, P5, P6) than when the position of the side 47 coincides with the position of the side 51 (P1).

Third Embodiment

Figure 6:
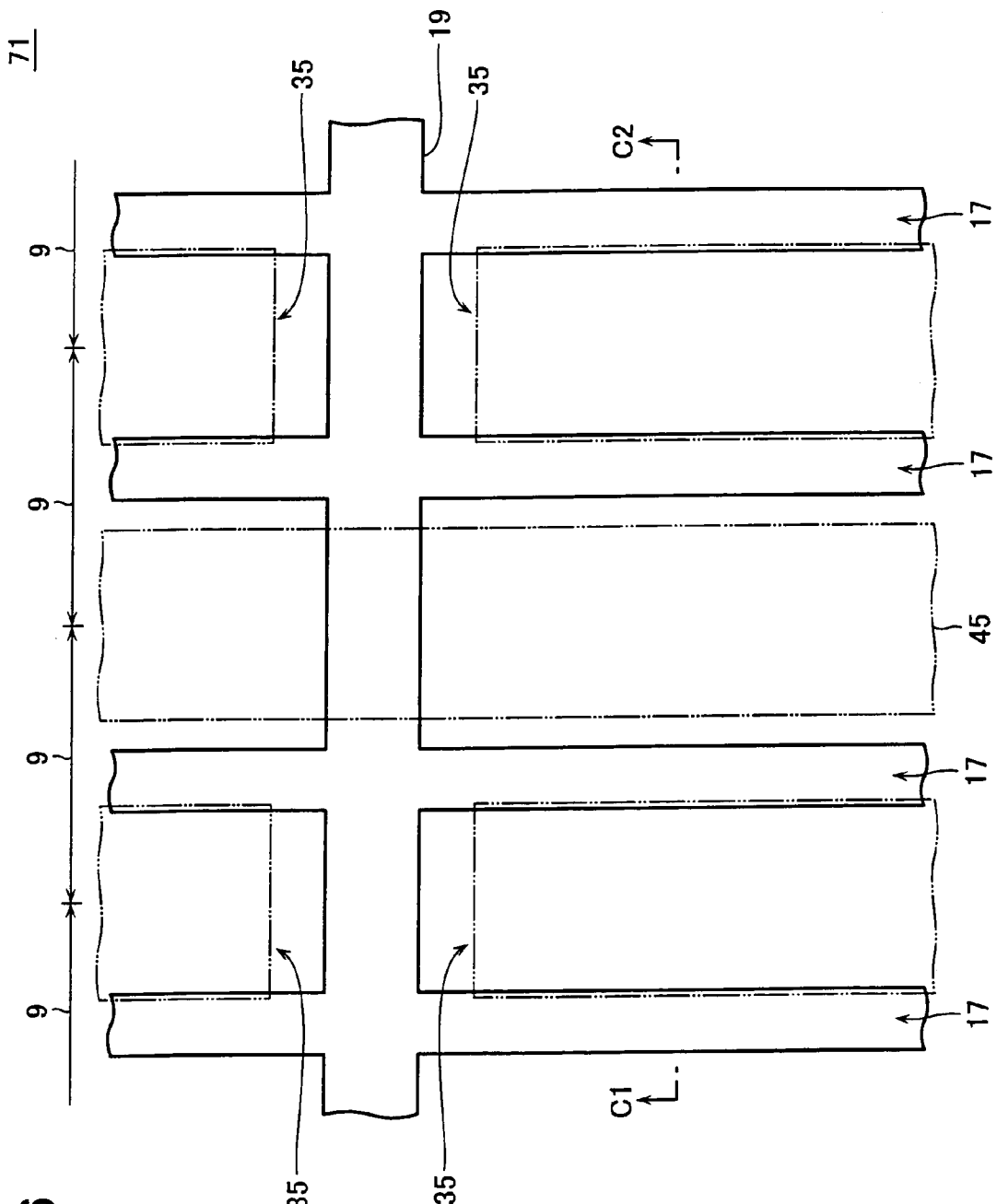
FIG. 6 is a plan view of part of a semiconductor device according to a third embodiment.
Figure 7:
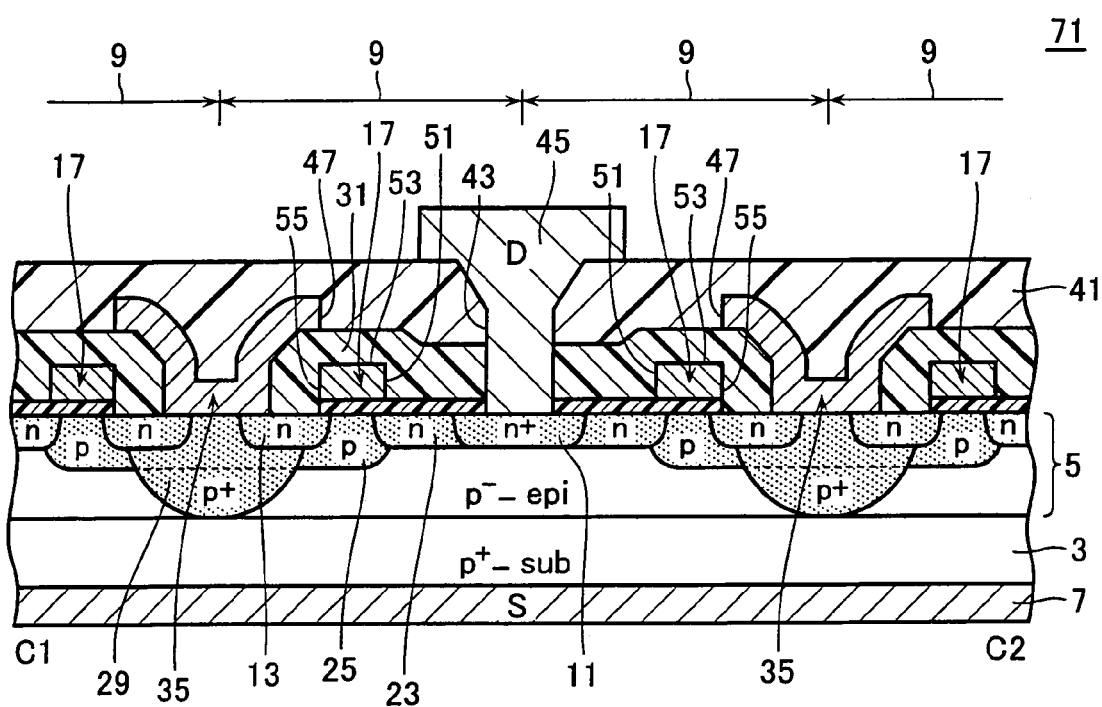
FIG. 7 is a cross-sectional view taken along C1-C2 line in FIG. 6.

FIG. 6 is a plan view of part of a semiconductor device 71 according to a third embodiment and corresponds to FIG. 1. FIG. 6 shows the gate electrode 17, the gate line 19, the short electrode 35 and the drain electrode 45 and omits the impurity regions. FIG. 7 is a cross-sectional view taken along C1-C2 line in FIG. 6 and corresponds to FIG. 2.

In the third embodiment, the drain electrode 45 on the second interlayer insulator 41 is not formed over the entire surface of the second interlayer insulator 41 but restricted to locate closer to the contact hole 43 than the side 51 of the gate electrode 17 located toward the drain region. Accordingly, the drain electrode 45 is not present on the upper surface 53 of the gate electrode 17. Therefore, the parasitic capacitance of (3) described in the first embodiment, that is, the parasitic capacitance between the gate electrode 17 and the drain electrode 45 on the second interlayer insulator 41 can be made smaller, thereby reducing the feedback capacitance.

The side 47 of the short electrode 35 coincides with the side 55 of the gate electrode 17 located toward the source region with respect to positions in the direction defined as directing from the source region 13 toward the drain region 11. Therefore, different from the preceding embodiments, the upper surface 53 of the gate electrode 17 is not covered in the short electrode 35. Even such the structure can prevent the feedback capacitance from increasing because the drain electrode 45 is not present on the upper surface 53 of the gate electrode 17.

Fourth Embodiment

Figure 8:
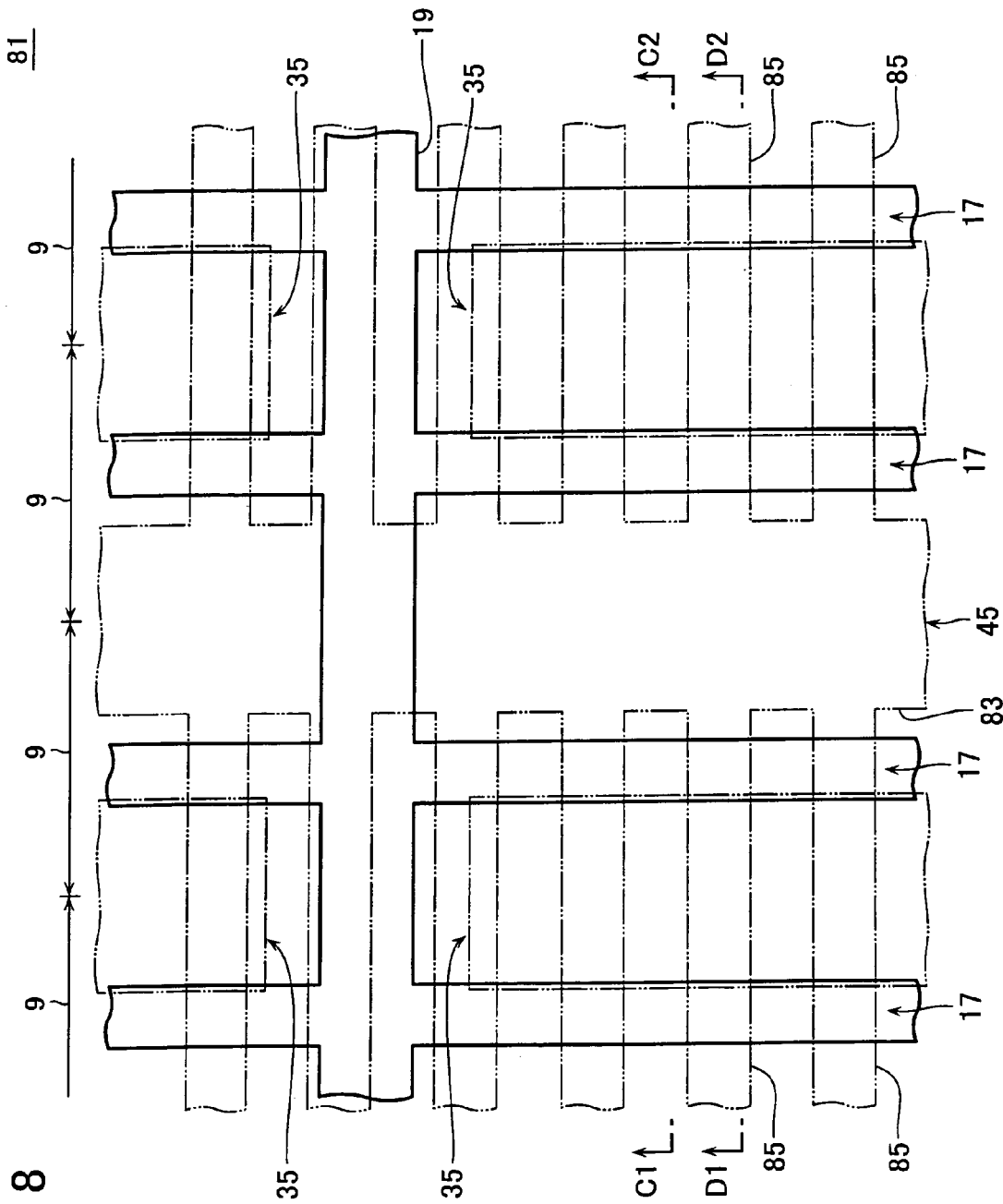
FIG. 8 is a plan view of part of a semiconductor device according to a fourth embodiment.
Figure 9:
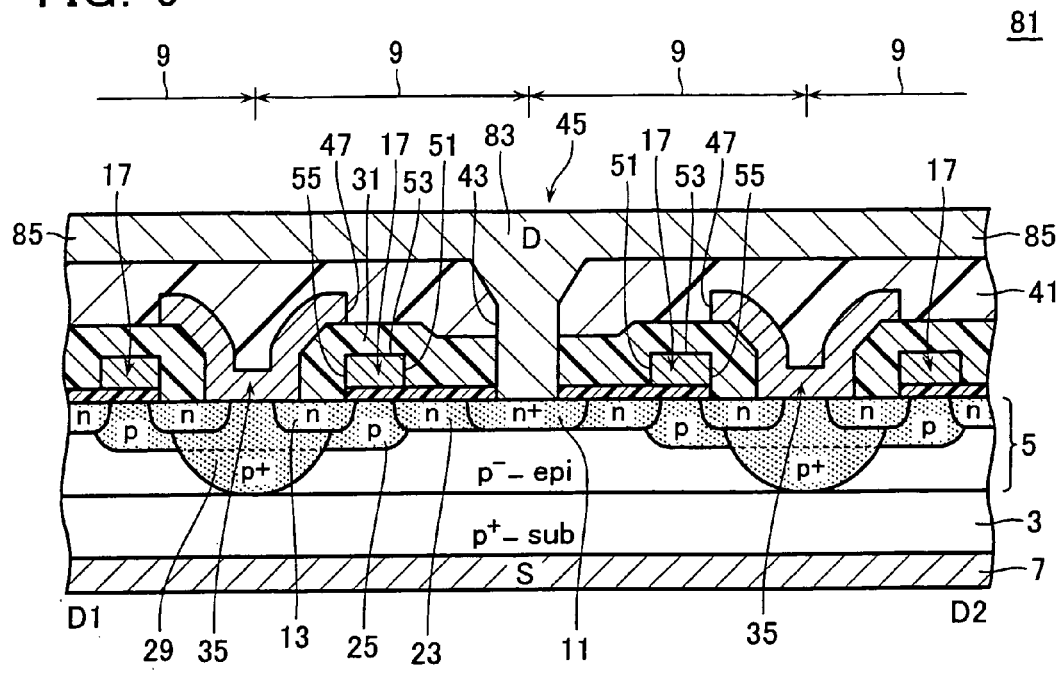
FIG. 9 is a cross-sectional view taken along D1-D2 line in FIG. 8.

FIG. 8 is a plan view of part of a semiconductor device 81 according to a fourth embodiment and corresponds to FIG. 6. FIG. 9 is a cross-sectional view taken along D1-D2 line in FIG. 8. A cross-sectional view taken along C1-C2 line in FIG. 8 is similar to FIG. 7. The fourth embodiment is described mainly on the difference from the third embodiment.

The semiconductor device 81 of the fourth embodiment differs from the semiconductor device 71 of the third embodiment in layout of the drain electrode 45. The drain electrode 45 disposed on the second interlayer insulator 41 in the semiconductor device 81 has a parallel portion 83 and a plurality of intersectional portions 85. The parallel portion 83 is located closer to the contact hole 43 than the side 51 of the gate electrode 17 located toward the drain region and in parallel with the gate electrode 17. The parallel portion 83 is shaped similar to the shape of the drain electrode 45 shown in FIG. 6.

The intersectional portions 85 are branched from the parallel portion 83 and intersect the gate electrode 17. These intersectional portions 85 are aligned at a certain pitch in the direction of the gate line 17 extending. Therefore, the drain electrode 45 is partly removed from above the gate electrode 17. Accordingly, in the semiconductor device 81 of the fourth embodiment, the drain electrode 45 is not partly present on the upper surface 53 of the gate electrode 17. Therefore, in accordance with the fourth embodiment, the parasitic capacitance between the gate electrode 17 and the drain electrode 45 on the second interlayer insulator 41 can be made smaller, thereby reducing the feedback capacitance.

The drain electrode 45 in the semiconductor device 81 according to the fourth embodiment has a larger area by the presence of the intersectional portions 85 than that of the drain electrode 45 in the semiconductor device 71 according to the third embodiment. Therefore, the wiring resistance associated with the drain electrode 45 can be made lower in the fourth embodiment than in the third embodiment.

Fifth Embodiment

Figure 10:
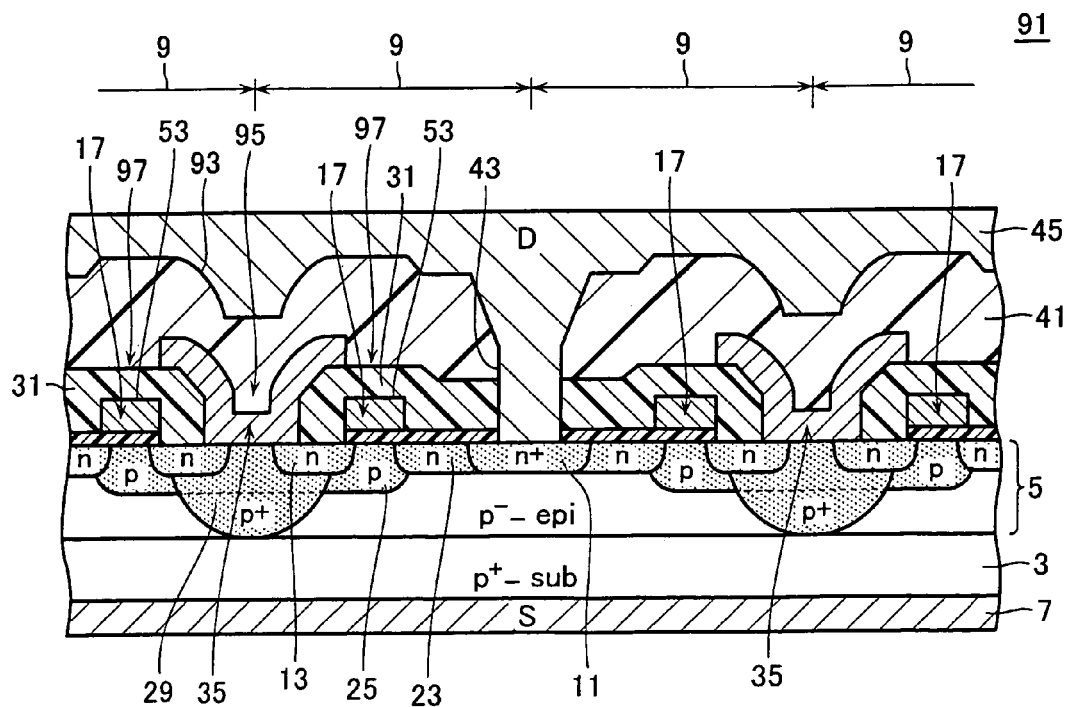
FIG. 10 is a plan view of part of a semiconductor device according to a fifth embodiment.

FIG. 10 is a plan view of part of a semiconductor device 91 according to a fifth embodiment. The fifth embodiment is described mainly on the difference from the semiconductor device 71 according to the third embodiment shown in FIGS. 6 and 7. The drain electrode 45 in the semiconductor device 91 is formed over the entire surface of the second interlayer insulator 41.

The second interlayer insulator 41 in the semiconductor device 91 is not planarized and accordingly the upper surface 93 of the second interlayer insulator 41 reflects the shape of the groundwork. Therefore, in comparison with a region 95 defined by removal of the first interlayer insulator 31, the surface 93 of the second interlayer insulator 41 is located higher in a region 97 defined by formation of the first interlayer insulator 31.

As the gate electrode 17 is covered in the first interlayer insulator 31, the surface 93 of the second interlayer insulator 41 above the gate electrode 17 is located at a relatively high elevation. Therefore, even if the drain electrode 45 is present on the upper surface 53 of the gate electrode 17, the drain electrode 45 and the gate electrode 17 have a relatively large distance therebetween. As a result, in accordance with the fifth embodiment, the parasitic capacitance between the gate electrode 17 and the drain electrode 45 on the second interlayer insulator 41 can be made smaller, thereby reducing the feedback capacitance.

Sixth Embodiment

Figure 11:
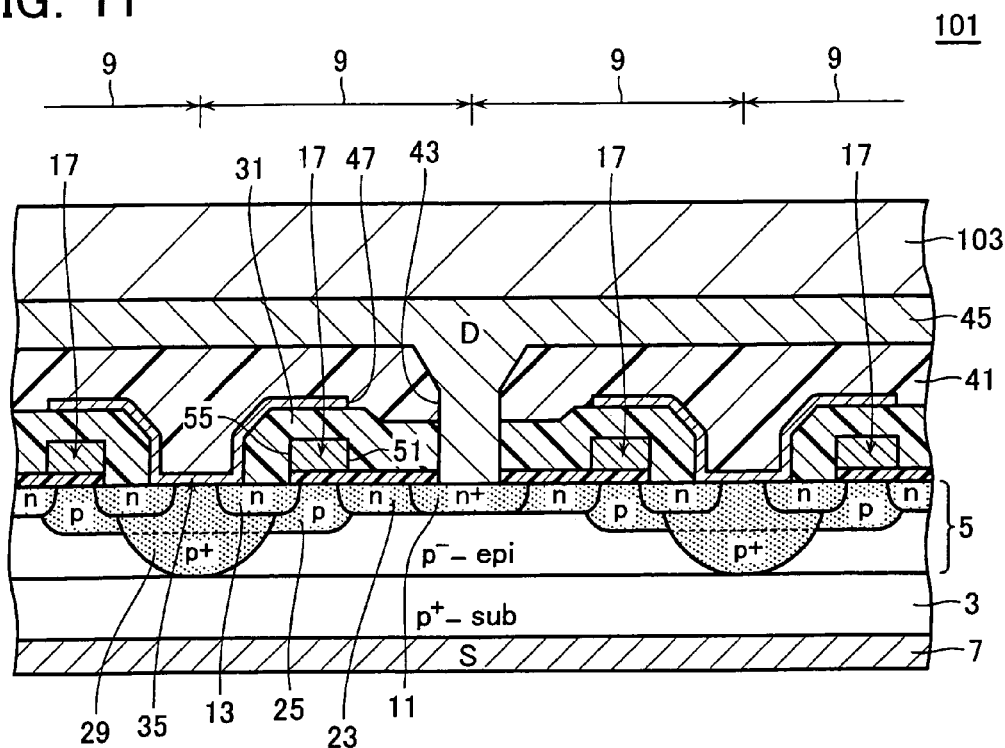
FIG. 11 is a plan view of part of a semiconductor device according to a sixth embodiment.

FIG. 11 is a plan view of part of a semiconductor device 101 according to a sixth embodiment. The semiconductor device 101 is described mainly on the difference from the semiconductor device 1 according to the first embodiment shown in FIG. 2. The short electrode 35 in the semiconductor device 101 according to the sixth embodiment has a thickness of 0.3 μm or below, which is thinner than that of the short electrode 35 in the semiconductor device 1 according to the first embodiment.

A strap electrode plate 103 is disposed on the drain electrode 45 in the semiconductor device 101. Pressing the strap electrode plate 103 against the drain electrode 45 and applying heat or ultrasonic to the strap electrode plate 103 can stick the strap electrode plate 103 on the drain electrode 45.

If the contact hole 43 has a larger aspect ratio (the depth of the contact hole/the diameter of the contact hole at the entrance), a metal can not be buried completely in the contact hole 43. In this case, a connection failure may arise between the drain electrode 45 and the drain region 11. A reduced thickness of the second interlayer insulator 41 or the short electrode 35 can lower the aspect ratio.

The second interlayer insulator 41 is composed of silicon oxide. Accordingly, if the thickness of the second interlayer insulator 41 is reduced, a crack is easily caused in the second interlayer insulator 41 at the time of sticking the strap electrode plate 103 thereto. Therefore, it is required to ensure a certain thickness of the second interlayer insulator 41 at the time of attaching the strap electrode plate 103 thereto.

The short electrode 35 composed of metal is stronger against a compressive stress compared to the second interlayer insulator 41 composed of silicon oxide. Therefore, in the sixth embodiment, the short electrode 35 is controlled to have a reduced thickness, thereby reducing the aspect ratio of the contact hole 43 and ensuring a certain thickness of the second interlayer insulator 41.

In the described sixth embodiment, the short electrode 35 having a reduced thickness is applied to the semiconductor device 1 according to the first embodiment. The strap electrode plate 103 and the short electrode 35 having a reduced thickness are also applicable to other embodiments.

Combinations of Embodiments

The parasitic capacitance between the gate electrode 17 and the drain electrode 45 on the second interlayer insulator 41 can be made much lower in combinations of the first through fifth embodiments, which are also considered as the embodiments of the present invention. The combinations are described below.

(1) The first embodiment and the fourth embodiment are combined in an arrangement. Alternatively, the second embodiment and the fourth embodiment are combined in an arrangement. Namely, in the semiconductor device according to the first (or second) embodiment, the drain electrode 45 in the fourth embodiment shown in FIG. 8 is arranged instead of the drain electrode 45 in the first (or second) embodiment.

Figure 12:
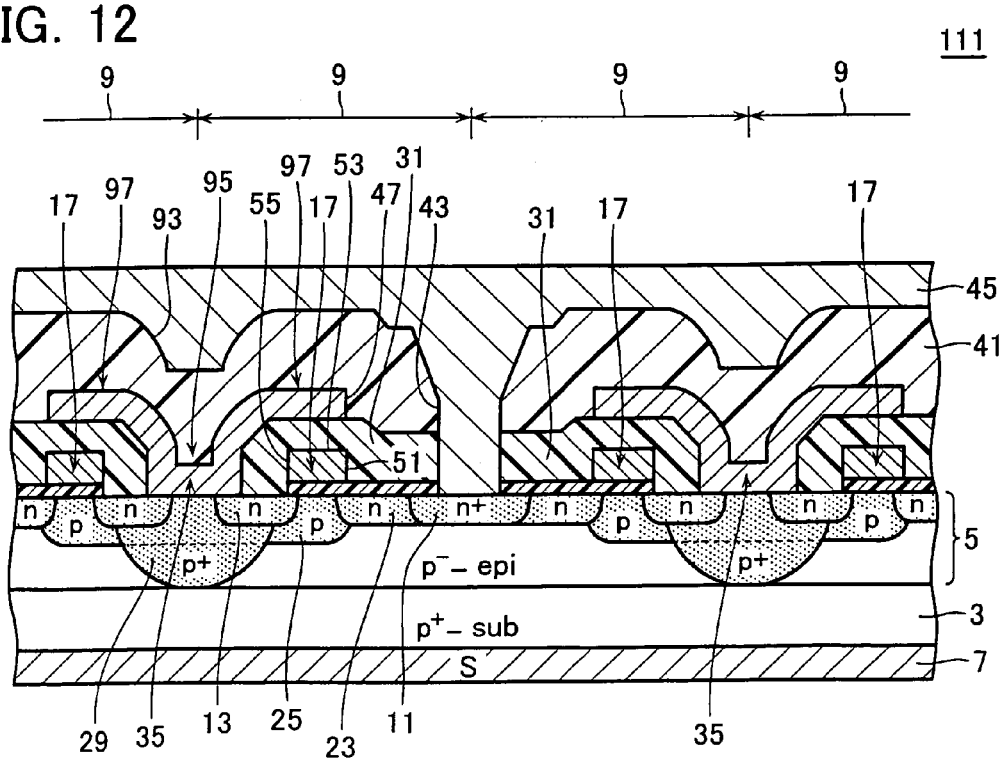
FIG. 12 is a cross-sectional view of a semiconductor device according to a combination of the first embodiment with the fifth embodiment.

(2) The first embodiment and the fifth embodiment are combined in an arrangement. Namely, like the semiconductor device 111 shown in FIG. 12, the second interlayer insulator 41 in the fifth embodiment shown in FIG. 10 is arranged instead of the second interlayer insulator 41 in the first embodiment shown in FIG. 2. The second embodiment and the fifth embodiment may be combined to achieve the similar arrangement.

(3) The fourth embodiment and the fifth embodiment are combined in an arrangement. Namely, in the semiconductor device according to the fourth embodiment, the second interlayer insulator 41 in the fifth embodiment is arranged instead of the second interlayer insulator 41 in the fourth embodiment.

(4) The first embodiment, the fourth embodiment and the fifth embodiment are combined in an arrangement. Alternatively, the second embodiment, the fourth embodiment and the fifth embodiment are combined in an arrangement. Namely, in the semiconductor device according to the first (or second) embodiment, the drain electrode 45 in the fourth embodiment is arranged instead of the drain electrode 45 in the first (or second) embodiment. In addition, the second interlayer insulator 41 in the fifth embodiment is arranged instead of the second interlayer insulator 41 in the fourth embodiment.

The strap electrode plate 103 and the short electrode 35 according to the sixth embodiment may be combined with each of the combinations (1)-(4).

What is claimed is:

1. A semiconductor device, comprising:
    a semiconductor substrate having an upper surface and a lower surface;
    a semiconductor layer formed on said upper surface of said semiconductor substrate;
    a base region of a first conduction type formed in said semiconductor layer;
    a source region of a second conduction type formed in said base region;
    a drain region of said second conduction type formed apart from said source region in said semiconductor layer;
    a gate electrode formed on a gate insulator above said semiconductor layer between said source region and said drain region;
    a first interlayer insulator formed on said semiconductor layer to cover said gate electrode;
    a short electrode formed to short said base region and said source region;
    a second interlayer insulator formed to cover said first interlayer insulator and said short electrode;
    a drain electrode formed over said second interlayer insulator and connected to said drain region with the use of a contact hole formed through said first and second interlayer insulators; and
    a source electrode formed on said lower surface of said semiconductor substrate,
    wherein said short electrode extends over said first interlayer insulator from said source region toward said drain region such that a side of said short electrode at least coincides with a side of said gate electrode located toward said drain region with respect to positions in a direction defined as directing from said source region toward said drain region.

2. The semiconductor device according to claim 1, wherein said drain electrode is partly removed from above said gate electrode.

3. The semiconductor device according to claim 2, wherein said drain electrode is located closer to said contact hole than a side of said gate electrode located toward said drain region, and wherein said drain electrode has a parallel portion extending in parallel with said gate electrode, and a plurality of intersectional portions branched from said parallel portion and intersecting said gate electrode.

4. The semiconductor device according to claim 1, wherein said second interlayer insulator has a surface located higher in a region defined by formation of said first interlayer insulator than in a region defined by removal of said first interlayer insulator.

5. The semiconductor device according to claim 1,
wherein said drain electrode is partly removed from above said gate electrode, and
wherein said second interlayer insulator has a surface located higher in a region defined by formation of said first interlayer insulator than in a region defined by removal of said first interlayer insulator.

6. The semiconductor device according to claim 1, wherein said drain electrode formed over entire said second interlayer insulator.

7. The semiconductor device according to claim 1, wherein a side of said short electrode coincides with a side of said gate electrode located toward said drain region with respect to positions in a direction defined as directing from said source region toward said drain region.

8. The semiconductor device according to claim 1, wherein a side of said short electrode is closer to said contact hole than a side of said gate electrode located toward said drain region with respect to positions in a direction defined as directing from said source region toward said drain region.

9. The semiconductor device according to claim 1, wherein said short electrode has a thickness of 0.3 µm or below.

10. The semiconductor device according to claim 9, further comprising a strap electrode plate disposed on said drain electrode.

11. A semiconductor device, comprising:
a semiconductor substrate having an upper surface and a lower surface;
a semiconductor layer formed on said upper surface of said semiconductor substrate;
a base region of a first conduction type formed in said semiconductor layer;
a source region of a second conduction type formed in said base region;
a drain region of said second conduction type formed apart from said source region in said semiconductor layer;
a gate electrode formed on a gate insulator above said semiconductor layer between said source region and said drain region;
a first interlayer insulator formed on said semiconductor layer to cover said gate electrode;
a short electrode formed to short said base region and said source region;
a second interlayer insulator formed to cover said first interlayer insulator and said short electrode;
a drain electrode formed above said second interlayer insulator and connected to said drain region with the use of a contact hole formed through said first and second interlayer insulators; and
a source electrode formed on said lower surface of said semiconductor substrate,
wherein said drain electrode is at least partly removed from above said gate electrode.

12. The semiconductor device according to claim 11, wherein said drain electrode is located closer to said contact hole than a side of said gate electrode located toward said drain region.

13. The semiconductor device according to claim 11, wherein said drain electrode is located closer to said contact hole than a side of said gate electrode located toward said drain region, and wherein said drain electrode has a parallel portion extending in parallel with said gate electrode, and a plurality of intersectional portions branched from said parallel portion and intersecting said gate electrode.

14. The semiconductor device according to claim 11, wherein said second interlayer insulator has a surface located higher in a region defined by formation of said first interlayer insulator than in a region defined by removal of said first interlayer insulator.

15. The semiconductor device according to claim 11, wherein said short electrode has a thickness of 0.3 µm or below.

16. The semiconductor device according to claim 15, further comprising a strap electrode plate disposed on said drain electrode.

17. A semiconductor device, comprising:
a semiconductor substrate having an upper surface and a lower surface;
a semiconductor layer formed on said upper surface of said semiconductor substrate;
a base region of a first conduction type formed in said semiconductor layer;
a source region of a second conduction type formed in said base region;
a drain region of said second conduction type formed apart from said source region in said semiconductor layer;
a gate electrode formed on a gate insulator above said semiconductor layer between said source region and said drain region;
a first interlayer insulator formed on said semiconductor layer to cover said gate electrode;
a short electrode formed to short said base region and said source region;
a second interlayer insulator formed to cover said first interlayer insulator and said short electrode;
a drain electrode formed over said second interlayer insulator and connected to said drain region with the use of a contact hole formed through said first and second interlayer insulators; and
a source electrode formed on said lower surface of said semiconductor substrate,
wherein said second interlayer insulator has a surface located higher in a region defined by formation of said first interlayer insulator than in a region defined by removal of said first interlayer insulator.

18. The semiconductor device according to claim 17, wherein said drain electrode formed over entire said second interlayer insulator.

19. The semiconductor device according to claim 17, wherein said short electrode has a thickness of 0.3 µm or below.

20. The semiconductor device according to claim 19, further comprising a strap electrode plate disposed on said drain electrode.

* * * * *